US008674381B2

(12) United States Patent  
Sakamoto et al.

(10) Patent No.: US 8,674,381 B2
(45) Date of Patent: Mar. 18, 2014

(54) NITRIDE SEMICONDUCTOR LIGHT EMITTING DEVICE

(75) Inventors: Takahiko Sakamoto, Anan (JP); Yasutaka Hamaguchi, Anan (JP)

(73) Assignee: Nichia Corporation, Anan (JP)

( * ) Notice: Subject to any disclaimer, the term of this patent is extended or adjusted under 35 U.S.C. 154(b) by 154 days.

(21) Appl. No.: 12/983,708

(22) Filed: Jan. 3, 2011

(65) Prior Publication Data

US 2011/0095265 A1   Apr. 28, 2011

Related U.S. Application Data

(62) Division of application No. 11/806,054, filed on May 29, 2007, now Pat. No. 7,884,379.

(30) Foreign Application Priority Data

May 29, 2006 (JP) ................................ 2006-148613
May 17, 2007 (JP) ................................ 2007-131658

(51) Int. Cl.
*H01L 29/205*   (2006.01)
*H01L 33/00*   (2010.01)
*H01L 27/15*   (2006.01)
*H01L 29/165*   (2006.01)
*H01L 31/12*   (2006.01)

(52) U.S. Cl.
USPC .............. 257/91; 257/85; 257/94; 257/95; 257/98; 257/99; 257/E33.025; 257/E33.028; 257/E33.03; 257/E33.033

(58) Field of Classification Search
USPC .............. 257/81, 85, 94, 91, 99, 98, E33.025, 257/E33.028, E33.03, E33.033, E33.062, 257/E33.066, 95
See application file for complete search history.

(56) References Cited

U.S. PATENT DOCUMENTS 7,495,259 B2   2/2009   Sakamoto et al.
7,893,447 B2   2/2011   Lee et al.
(Continued)

FOREIGN PATENT DOCUMENTS

JP   6-338632 A   6/1994
JP   2000-164930 A   6/2000
(Continued)

OTHER PUBLICATIONS

JP Office Action issued in corresponding JP application No. 2007-131658 dated Feb. 7, 2012.
(Continued)

*Primary Examiner* — Teresa M Arroyo
(74) *Attorney, Agent, or Firm* — Birch, Stewart, Kolasch & Birch, LLP

(57) ABSTRACT

A nitride semiconductor light emitting device is provided with a substrate, an n-type nitride semiconductor layer, a p-type nitride semiconductor layer, an n-side pad electrode, a translucent electrode and a p-side pad electrode, wherein the translucent electrode is formed from an electrically conductive oxide, the n-side pad electrode adjoins the periphery of the translucent electrode and the p-side pad electrode is disposed so as to satisfy the following relationships:

$0.3L \leq X \leq 0.5L$ and $0.2L \leq Y \leq 0.5L$ where X is the distance between ends of the p-side pad electrode and the n-side pad electrode, Y is the distance between the end of the p-side pad electrode and the periphery of the translucent electrode, L is the length of the translucent electrode on the line connecting the centroids of the p-side pad electrode and the n-side pad electrode minus the outer diameter d of the p-side pad electrode.

25 Claims, 15 Drawing Sheets

(56) References Cited

U.S. PATENT DOCUMENTS

| | | |
|---|---|---|
| 7,977,134 B2 | 7/2011 | Lee et al. |
| 7,994,525 B2 | 8/2011 | Lee et al. |
| 2006/0038190 A1 | 2/2006 | Park et al. |
| 2011/0084305 A1 | 4/2011 | Lee et al. |
| 2011/0193060 A1 | 8/2011 | Lee et al. |

FOREIGN PATENT DOCUMENTS

| | | |
|---|---|---|
| JP | 2004-221529 A | 8/2004 |
| JP | 2004-363537 | 12/2004 |
| JP | 2005-317931 | 11/2005 |
| JP | 2007-103951 A | 4/2007 |
| JP | 2008-244503 A | 10/2008 |
| JP | 3147670 U | 12/2008 |

OTHER PUBLICATIONS

US Office Action issued Feb. 3, 2009 in parent U.S. Appl. No. 11/806,054.

US Office Action issued Jul. 8, 2010 in parent U.S. Appl. No. 11/806,054.

US Office Action issued Nov. 27, 2009 in parent U.S. Appl. No. 11/806,054.

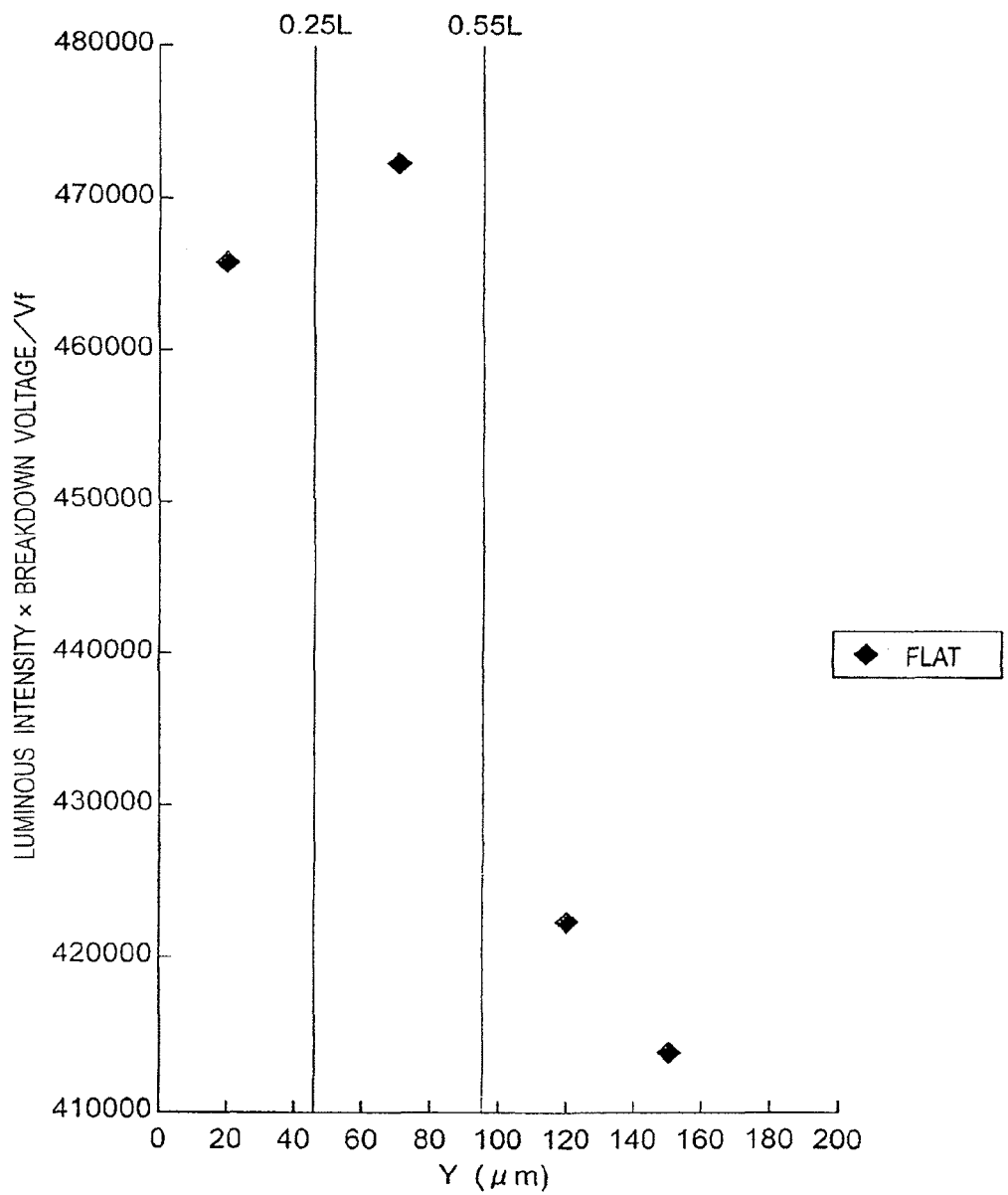

NITRIDE SEMICONDUCTOR LIGHT EMITTING DEVICE

CROSS REFERENCE TO RELATED APPLICATIONS

This application is a divisional of application Ser. No. 11/806,054 filed on May 29, 2007, now U.S. Pat. No. 7,884,379, which claims priority to foreign Application Nos. P2007-131658 filed on May 17, 2007 and P2006-148613 filed on May 29, 2006 in Japan. The entire contents of each of these applications are hereby incorporated by reference. The entire disclosure of parent application Ser. No. 11/806,054 (U.S. Pat. No. 7,884,379) is germane to the invention as claimed in the present divisional application.

BACKGROUND OF THE INVENTION

1. Field of the Invention

The present invention relates a nitride semiconductor light emitting device comprising a nitride semiconductor represented by general formula of $In_xAl_yGa_{1-x-y}N$ ($0 \leq x \leq 1$, $0 \leq y \leq 1$), and particularly to a nitride semiconductor light emitting device having an n-side pad electrode and a p-side pad electrode formed on the same side of a substrate.

2. Description of the Related Art

A nitride semiconductor light emitting device commonly used is constituted by forming at least an n-type nitride semiconductor layer and a p-type nitride semiconductor layer one on another on a substrate made of sapphire, SiC, GaN or the like. The p-type nitride semiconductor layer has a p-side pad electrode formed thereon for connecting to a positive terminal of an external power source, and the n-type nitride semiconductor layer has an n-side pad electrode formed thereon for connecting to a negative terminal of the external power source. Electric current flows from the p-side pad electrode to the n-side pad electrode, so as to cause light emission.

In case an insulating substrate such as sapphire is used, the n-side pad electrode cannot be formed on the back surface of the substrate. Therefore the p-type nitride semiconductor layer and a part of the n-type nitride semiconductor layer are removed so as to expose the n-type nitride semiconductor layer on the top side, and the n-side pad electrode is formed thereon.

Also, because the p-type nitride semiconductor layer has a sheet resistance higher than that of the n-type nitride semiconductor layer, a translucent electrode is often formed between the p-side pad electrode and the p-type nitride semiconductor layer in order to assist the diffusion of current in the p-type nitride semiconductor layer (refer to, for example, Japanese Patent Unexamined Publication (Kokai) No. 6-338632). The translucent electrode is formed over substantially the entire surface of the p-type nitride semiconductor layer, from a translucent material such as thin metal film so as to spread the current throughout the p-type nitride semiconductor layer and not to block light emission.

Japanese Patent Unexamined Publication (Kokai) No. 2000-164930 proposes to improve the current distribution by forming linear extensions from the n-side pad electrode and from the p-side pad electrode, on a nitride semiconductor device having the n-side pad electrode and the p-side pad electrode formed on the same side of a substrate. FIG. 9 is a plan view showing an example of the nitride semiconductor device disclosed in Japanese Patent Unexamined Publication (Kokai) No. 2000-164930. In this example, an extension 12a is formed to extend from the n-side pad electrode 12 and surround the device in a C shape, so as to improve the distribution of current which flows from the p-side pad electrode 16 to the n-side pad electrode 12.

In the nitride semiconductor light emitting device having the constitution described above, uniformity of current distribution within the device plane deteriorates when the p-side and n-side electrodes are not well-balanced in the resistance to the current flowing along the surface (substantially determined by the balance of sheet resistance between the translucent electrode formed on the p-type nitride semiconductor layer and the n-type nitride semiconductor layer). Particularly in case the translucent electrode is formed from an electrically conductive oxide such as indium tin oxide (hereinafter referred to as "ITO"), the translucent electrode tends to have higher sheet resistance than that of the n-type nitride semiconductor layer. As a result, such a problem can easily occur that current flows more around the p-side pad electrode and less around the n-side pad electrode. Uneven current distribution within the element plane may lead to a problem related to the electrical characteristic such as higher value of Vf (forward voltage).

Also, the problem described above becomes more significant as the shape of the device becomes more proximate to rectangle. This is because a device having rectangular shape has longer path from the p-side pad electrode to the n-side pad electrode than a square device having the same surface area.

This problem may be addressed by forming linear extensions which extend from the n-side pad electrode and the p-side pad electrode as described in Japanese Patent Unexamined Publication (Kokai) No. 2000-164930. However, the n-side pad electrode and the p-side pad electrode, including the extensions thereof, have the property of blocking light, and absorb light. Thus simply forming the linear extensions from the n-side pad electrode and from the p-side pad electrode leads to smaller area of light emission as the extensions become longer, thus resulting in a decrease in the efficiency of light emission due to the absorption of light.

SUMMARY OF THE INVENTION

With the background described above, the present invention has an object of providing a nitride semiconductor light emitting device having a translucent electrode formed from an electrically conductive oxide, which is capable of improving the uniformity of light emission and decreasing the value of Vf, without forming long extensions from the n-side pad electrode and the p-side pad electrode.

The nitride semiconductor light emitting device of the present invention comprises a substrate, an n-type nitride semiconductor layer formed on the substrate, a p-type nitride semiconductor layer formed on the n-type nitride semiconductor layer, an n-side pad electrode formed on a surface of the n-type nitride semiconductor layer exposed by removing the p-type nitride semiconductor layer and a part of the n-type nitride semiconductor layer, a translucent electrode formed on the p-type nitride semiconductor layer and a p-side pad electrode formed within the surface of the translucent electrode, wherein the translucent electrode is formed from an electrically conductive oxide, the n-side pad electrode adjoins the periphery of the translucent electrode and the p-side pad electrode is disposed so as to satisfy the following relationships:

$$0.4L \leq X \leq 0.7L \text{ and } 0.25L \leq Y \leq 0.55L$$

where X is the distance between ends of the p-side pad electrode and the n-side pad electrode, Y is the distance between the end of the p-side pad electrode on the side opposite to the n-side pad electrode and the periphery of the translucent electrode on a line connecting the centroids of the n-side pad electrode and the p-side pad electrode, L is the length of the translucent electrode on the line connecting the centroids of the n-side pad electrode and the p-side pad electrode minus the outer diameter d of the p-side pad electrode.

The outer diameter d of the p-side pad electrode refers to the outer diameter d of the p-side pad electrode on the line connecting the centroids of the n-side pad electrode and the p-side pad electrode. When the p-side pad electrode has a linear extension, the outer diameter of a portion with the extension removed will be referred to as d.

Through a research conducted by the inventors of the present application, it was found that the uniformity of light emission can be improved and the value of Vf can be decreased while maintaining sufficient luminous intensity of emission and sufficient endurance for electrostatic breakdown of the device, by forming the p-side pad electrode at a position a little inward of the translucent electrode, namely at a position that satisfies the relationships described above, particularly when the translucent electrode is formed from an electrically conductive oxide. This is because, since the translucent electrode formed from an electrically conductive oxide tends to have higher sheet resistance than that of the n-type nitride semiconductor layer, current which would otherwise be concentrated around the p-side pad electrode can be spread uniformly throughout the device plane by forming the p-side pad electrode at a position a little inward of the translucent electrode. Particularly it is preferable that X and Y satisfy the following relationship, which enables it to provide a device that emits light with higher uniformity and has lower value of Vf.

$$0.5L \leq X \leq 0.6L \text{ and } 0.3L \leq Y \leq 0.5L$$

The nitride semiconductor light emitting device of the present invention preferably has a plurality of protrusions formed from at least the p-type nitride semiconductor layer along the periphery of the device. This makes it possible to further improve the uniformity of light emission due to the arrangement of the p-side pad electrode, thereby to have the entire surface of the device contribute effectively to light emission.

It is also preferable that top surface of the substrate has irregularity so as to suppress multiple reflections of light within the device, thereby improving the efficiency of extracting light.

According to the present invention, as described above, it is made possible to provide the nitride semiconductor light emitting device which has the translucent electrode formed from the electrically conductive oxide and is capable of improving the uniformity of light emission and decreasing the value of Vf, without forming long extensions from the n-side pad electrode and from the p-side pad electrode.

BRIEF DESCRIPTION OF THE DRAWINGS

FIG. 6D is a graph showing the dependency of luminous intensity Iv×breakdown voltage/Vf on the distance Y between the end of the p-side pad electrode and the periphery of the translucent electrode.

DESCRIPTION OF REFERENCE NUMERALS

Figure 1:
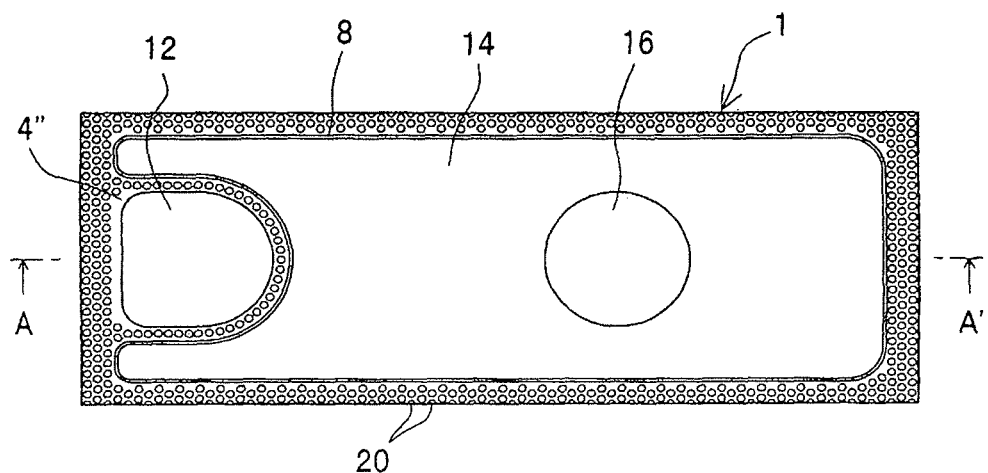
FIG. 1 is a plan view schematically showing a nitride semiconductor light emitting device according to one embodiment of the present invention.

1 Nitride semiconductor light emitting device
2 Substrate
4 n-type nitride semiconductor layer
6 Active layer
8 p-type nitride semiconductor layer
12 n-side pad electrode
14 Translucent electrode
16 p-side pad electrode
18 Irregular structure
18a Dimple
18b Projection
20 Protrusion
30 Package 32 Recess
34 n-side lead electrode
36 p-side lead electrode
40 Electrically conductive wire
42 Light emitting surface
50 Light emitting apparatus

DETAILED DESCRIPTION OF THE INVENTION

Figure 2:
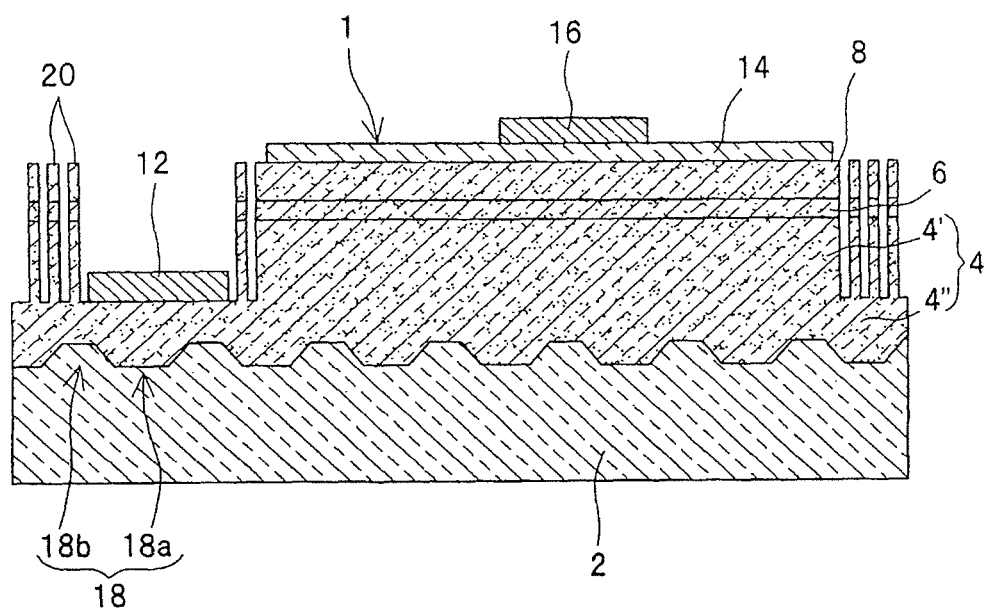
FIG. 2 is a sectional view schematically showing a section taken along lines A-A' of the nitride semiconductor light emitting device shown in FIG. 1.

FIG. 1 is a top view showing an example of the nitride semiconductor light emitting device of the present invention. FIG. 2 is a sectional view taken along lines A-A' of FIG. 1. As shown in FIG. 1, the nitride semiconductor light emitting device of this embodiment has rectangular shape of a large aspect ratio in plan view, with the n-side pad electrode 12 and the p-side pad electrode 16 disposed along the longer side of the rectangle. The nitride semiconductor light emitting device 1 has double-heterojunction structure constituted by forming an n-type nitride semiconductor layer 4, an active layer 6 and a p-type nitride semiconductor layer 8 one on another on a substrate 2 made of sapphire, SiC, GaN or the like. In this embodiment, since the active layer 6 is formed from n-type nitride semiconductor layer, both the n-type nitride semiconductor layer and the active layer 6 correspond to the n-type nitride semiconductor layer of the present invention.

The p-type nitride semiconductor layer 8 has a translucent electrode 14 formed on substantially the entire surface thereof from electrically conductive oxide such as ITO, whereon the p-side pad electrode 16 is formed so as to connect to an external circuit by means of wire bonding or the like. On the other hand, in a rectangular region along the periphery of the element and a substantially semi-circular region along one short side of the device, the p-type nitride semiconductor layer 8, the active layer 6 and a top portion 4' of the n-type nitride semiconductor layer 4 are removed so as to expose the surface of a bottom portion 4" of the n-type nitride semiconductor layer 4. The n-side pad electrode 12 is formed on the bottom portion 4" of the n-type nitride semiconductor layer 4 which is exposed in the substantially semi-circular region (exposed surface). The nitride semiconductor light emitting device 1 looks as shown in FIG. 1 when viewed from above. The p-type nitride semiconductor layer 8 is formed in a shape of substantially rectangular island having an arcuate notch in one side thereof, and has the translucent electrode 14 formed over almost the entire top surface. The p-side pad electrode 16 is disposed within the plane of the translucent electrode 14. The n-side pad electrode 12 is located on the exposed surface of the n-type nitride semiconductor layer 4', and is disposed along the arcuate notch of the p-type nitride semiconductor layer 8.

The entire top surface of the nitride semiconductor light emitting device 1 is covered and protected by an insulating film (not shown) such as SiO$_2$. The insulating film has opening so that part of the n-side pad electrode 12 and of the p-side pad electrode 16 is exposed.

When current flows from the p-side pad electrode 16 to the n-side pad electrode 12, the current injected from the p-side pad electrode 16 is caused by the translucent electrode 14 to spread over the entire plane of the p-type nitride semiconductor layer 8, to pass through the active layer 6 and the n-type nitride semiconductor layer 4 and enters the n-type nitride semiconductor layer 12. As a result, light is emitted in the active layer 6 and is extracted through the top surface of the substrate via the translucent electrode 14. Also, because light emitted in the active layer 6 propagates transversely, entire surface of the device acts as the emission region when viewed from above.

In this embodiment, as shown in FIG. 1 and FIG. 2, the p-type nitride semiconductor layer 8, the active layer 6 and a top portion 4' of the n-type nitride semiconductor layer 4 are removed in such a manner that a dot-patterned portion in plan view is left to remain. As a result, in the rectangular region along the periphery of the device and the substantially semi-circular region along one short side of the device, a plurality of columnar protrusions 20 constituted from the p-type nitride semiconductor layer 8, the active layer 6 and the top portion 4' of the n-type nitride semiconductor layer 4 are formed on the bottom portion 4" of the n-type nitride semiconductor layer 4 (exposed surface) which is exposed in the substantially semi-circular region (however, the protrusions 20 are not formed in the region where the p-side pad electrode 12 is formed). Depth of the protrusions 20 is not necessarily such that reaches the n-side pad electrode 4, and may be such that reaches only the active layer 6 or a mid point of the p-type nitride semiconductor layer 8. The protrusions 20 preferably include at least the p-type nitride semiconductor layer 8, since this enables it to form the protrusion 20 by etching after stacking the nitride semiconductor layer. The top layer of the protrusions 20 may be formed from the same material as the translucent electrode 14. The protrusions 20 reflect the light which propagates in the transverse direction within the device so as to propagate in the longitudinal direction (in the direction perpendicular to the principal surface of the device). This enables it to increase the flux of light emitted from the top surface of the device upward, thereby increasing the luminous intensity in front of the device. While it is preferable that the protrusions 20 are formed at the same time as the exposed surface for the formation of the n-side pad electrode 12 is formed, since this simplifies the process, they may also be formed in different processes. In this case, etching for the formation of the protrusions 20 is preferably carried out to such a depth that reaches at least the active layer 6.

Moreover, as shown in FIG. 2, irregular structure 18 comprising a plurality of dimples 18a and protrusions 18b is formed on the surface of the substrate 2, so as to suppress multiple reflections of light within the device and improve the efficiency of extracting light to the outside of the device. The columnar protrusions 20 and the irregular structure formed on the substrate surface are not essential for the operation of the device, and can be omitted.

The nitride semiconductor light emitting device 1 of the present invention is characterized by the arrangement of the p-side pad electrode 16. That is, while the n-side pad electrode 12 is formed to adjoin the periphery of the translucent electrode 14 at an end of the device similarly to the prior art, the p-side pad electrode 16 is formed at a position a little inward unlike the prior art. In the prior art, it has been common to form the n-side pad electrode 12 and the p-side pad electrode 16 at either end of the device, so that current flows uniformly in the device as disclosed in Japanese Patent Unexamined Publication (Kokai) No. 6-338632. However, the inventors of the present invention found out through a research that, in case the translucent electrode 14 is formed from electrically conductive oxide, the uniformity of light emission can be improved further and the value of Vf can be decreased while maintaining sufficient luminous intensity of emission, by forming the p-side pad electrode 16 at a position a little inside of the translucent electrode 14. This is because, since the translucent electrode 14 made of electrically conductive oxide tends to have higher sheet resistance than that of the n-type nitride semiconductor layer 4, current which would otherwise be concentrated around the p-side pad electrode 16 can be spread uniformly throughout the device plane by forming the p-side pad electrode 16 at a position a little inside of the translucent electrode 14.

Figure 3:
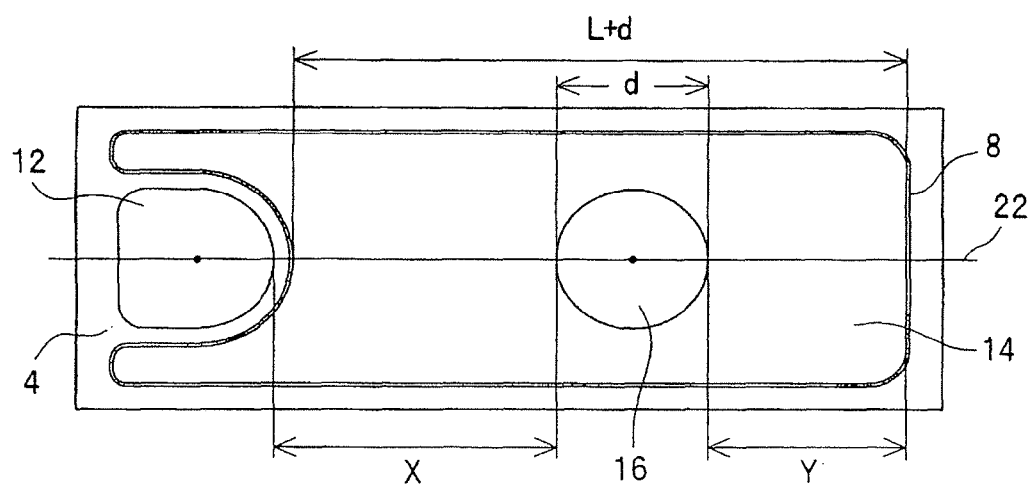
FIG. 3 is a schematic diagram showing the dimensions of the nitride semiconductor light emitting device.

Preferred arrangement of the p-side pad electrode 16 will now be described in detail. FIG. 3 is a plan view showing the dimensions of portions of the device according to this embodiment, where the columnar protrusions 20 are omitted. As shown in FIG. 3, X is defined as the distance between an end of the p-side pad electrode 16 nearer to the n-side pad electrode 12 and an end of the n-side pad electrode 12 nearer to the p-side pad electrode 16 (end-to-end distance). Y is defined as the distance between the end of the p-side pad electrode 16 on the side opposite to the n-side pad electrode 12 and the periphery of the translucent electrode 14 on a line 22 connecting the centroids of the n-side pad electrode 12 and the p-side pad electrode 16. L is defined as the length of the translucent electrode 14 on the line 22 connecting the centroids of the n-side pad electrode 12 and the p-side pad electrode 16 minus the outer diameter d of the p-side pad electrode.

The inventors of the present application found that uniformity of light emission can be improved further and the value of Vf can be decreased while maintaining sufficient luminous intensity of emission, by disposing the p-side pad electrode 16 in such a manner that X, Y and L satisfy the following relationships:

$0.4L \leq X \leq 0.7L$ and $0.25L \leq Y \leq 0.55L$

When the n-side pad electrode 12 and the p-side pad electrode 16 have linear extensions, X, Y and L which satisfy the above relationship are determined by using the dimensions of the n-side pad electrode 12 and the p-side pad electrode 16 with the extensions removed.

FIGS. 4A to 4D schematically show the distribution of light emission over the device surface with different positions of disposing the p-side pad electrode 16. Intensities of light emitted at different points of the device were measured on the device measuring 420 μm by 240 μm (aspect ratio 1.75) having the translucent electrode 14 measuring 260 μm in length and the p-side pad electrode 16 about 90 μm in diameter (L=260−90=170 μm) while changing the position of p-side pad electrode 16. Areas where light was emitted with ratio of intensity to the maximum intensity of each element in a range from 0.75 to 1 are shown in black. Areas where light was emitted with ratio of intensity to the maximum intensity in a range from 0 to 0.25 are shown in light grey, indicating the external shape of the device. A band-shaped portion extending from the p-side pad electrode is a probe used to supply electricity to the device.

Figure 4A:
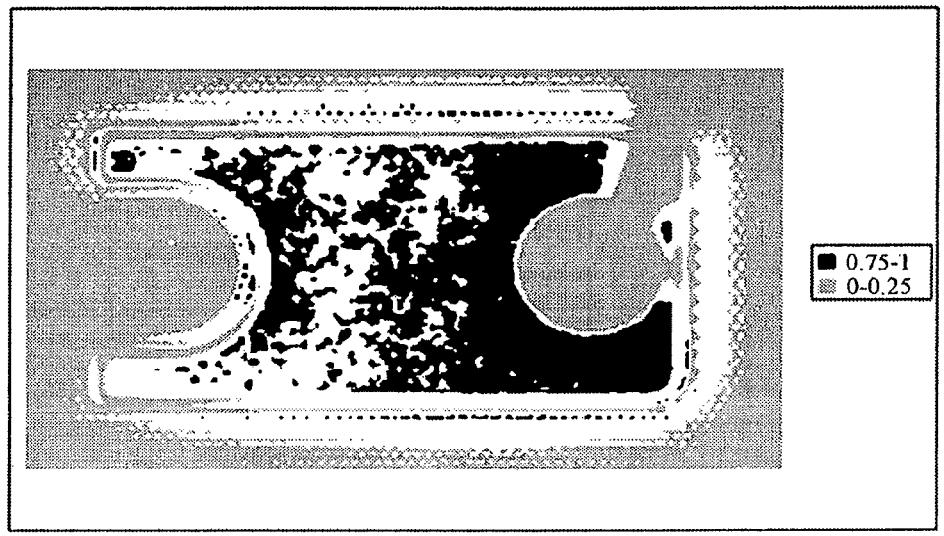
FIG. 4A is a photograph showing the distribution of light emission when the p-side pad electrode is at a position of X=0.88L and Y=0.12L.
Figure 4B:
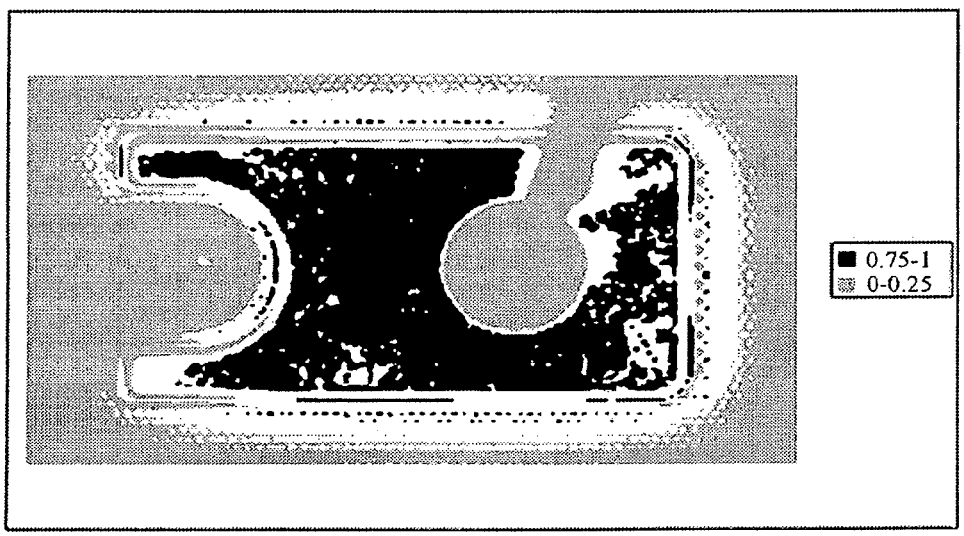
FIG. 4B is a photograph showing the distribution of light emission when the p-side pad electrode is at a position of X=0.59L and Y=0.41L.
Figure 4C:
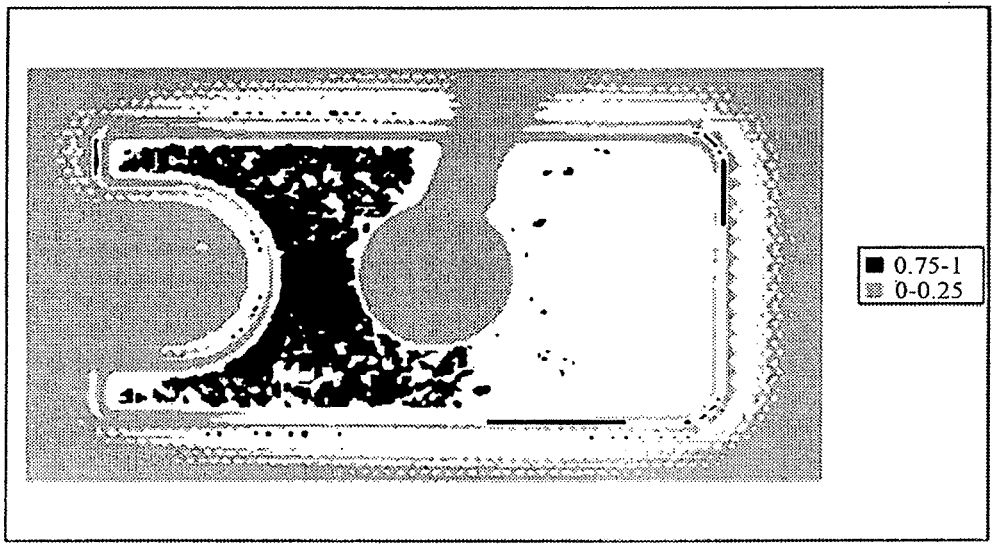
FIG. 4C is a photograph showing the distribution of light emission when the p-side pad electrode is at a position of X=0.29L and Y=0.71L.
Figure 4D:
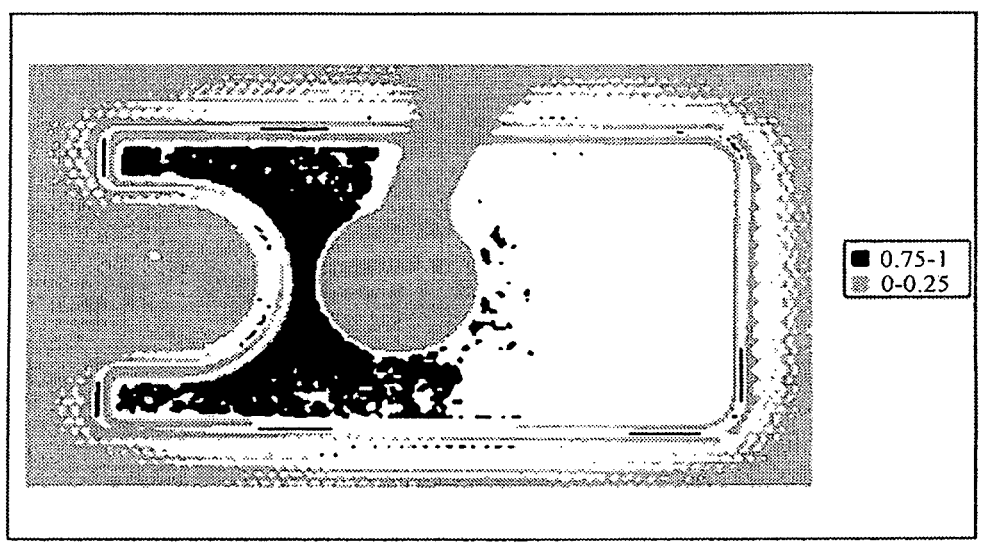
FIG. 4D is a photograph showing the distribution of light emission when the p-side pad electrode is at a position of X=0.12L and Y=0.88L.

FIG. 4A shows a case where the p-side pad electrode 16 was disposed at an end of the translucent electrode 14 as in the prior art, and FIGS. 4B through 4D show cases where the p-side pad electrode 16 was disposed in an inner area of the translucent electrode 14 so that the p-side pad electrode 16 becomes nearer to the n-side pad electrode 12. Distances X and Y in the cases represented in FIGS. 4A to 4D were as follows.

| FIG. 4A | X = 150 μm (0.88L) | Y = 20 μm (0.12L) |
| FIG. 4B | X = 100 μm (0.59L) | Y = 70 μm (0.41L) |
| FIG. 4C | X = 50 μm (0.29L) | Y = 120 μm (0.71L) |
| FIG. 4D | X = 20 μm (0.12L) | Y = 150 μm (0.88L) |

In the case shown in FIG. 4A where the p-side pad electrode 16 is disposed at an end of the translucent electrode 14 so that the entire translucent electrode 14 is interposed between the p-side pad electrode 16 and the n-side pad electrode 12 (X=0.88L, Y=0.12L), emission of light is concentrated around the p-side pad electrode 16. In the case shown in FIG. 4D where the p-side pad electrode 16 is disposed at a position proximate to the n-side pad electrode 12 (X=0.12L, Y=0.88L), emission of light is concentrated in an area between the n-side pad electrode 12 and the p-side pad electrode 16. In the cases shown in FIG. 4B (X=0.59L, Y=0.41L) and FIG. 4C (X=0.29L, Y=0.71L) where the p-side pad electrode 16 is disposed at a position apart from the n-side pad electrode 12 and from the end of the translucent electrode 14, relatively uniform emission of light is obtained. In particular, the most uniform distribution of emission is obtained with the arrangement shown in FIG. 4B (X=0.59L, Y=0.41L).

Figure 5A:
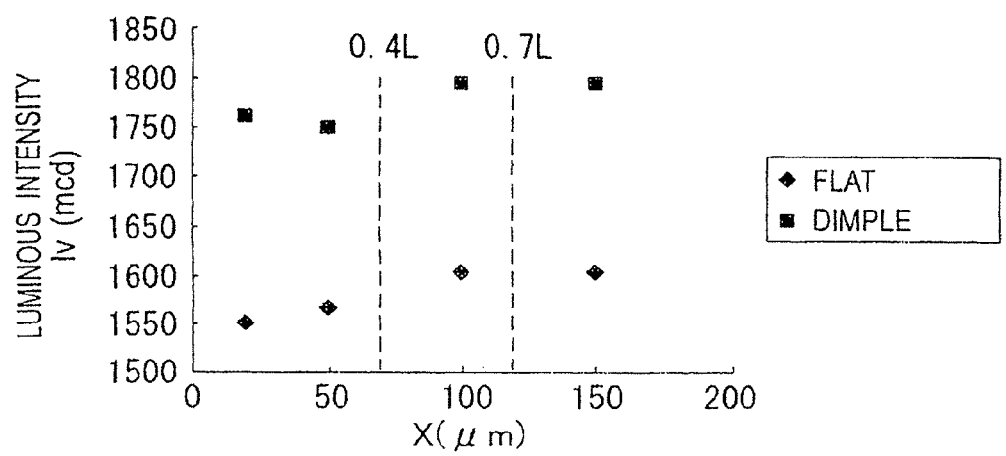
FIG. 5A is a graph showing the dependency of luminous intensity on the end-to-end distance X between the p-side pad electrode and the n-side pad electrode.
Figure 5B:
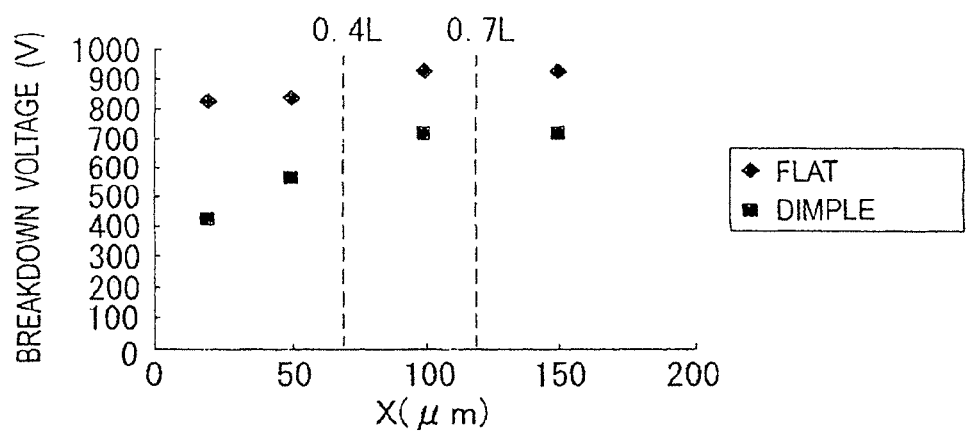
FIG. 5B is a graph showing the dependency of breakdown voltage on the end-to-end distance X between the p-side pad electrode and the n-side pad electrode.
Figure 5C:
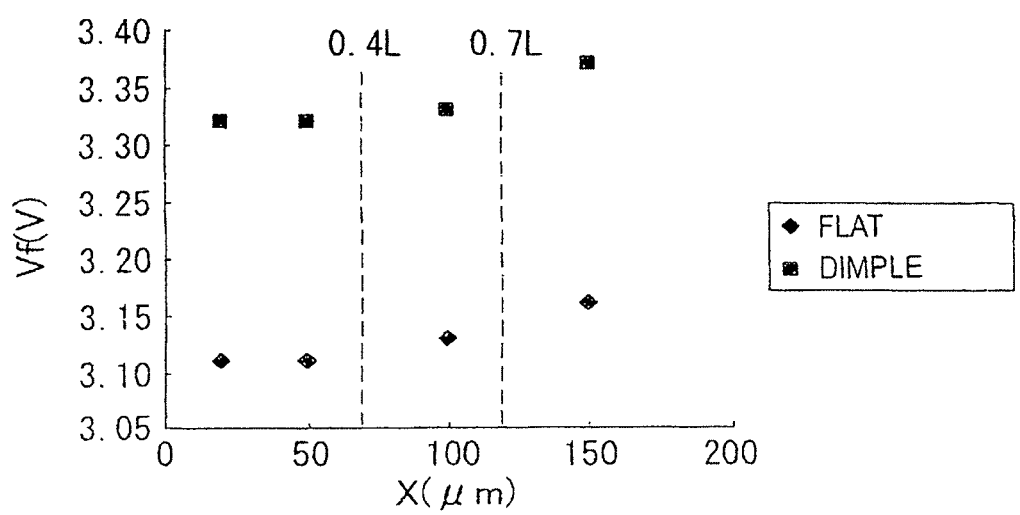
FIG. 5C is a graph showing the dependency of Vf on the end-to-end distance X between the p-side pad electrode and the n-side pad electrode.
Figure 6A:
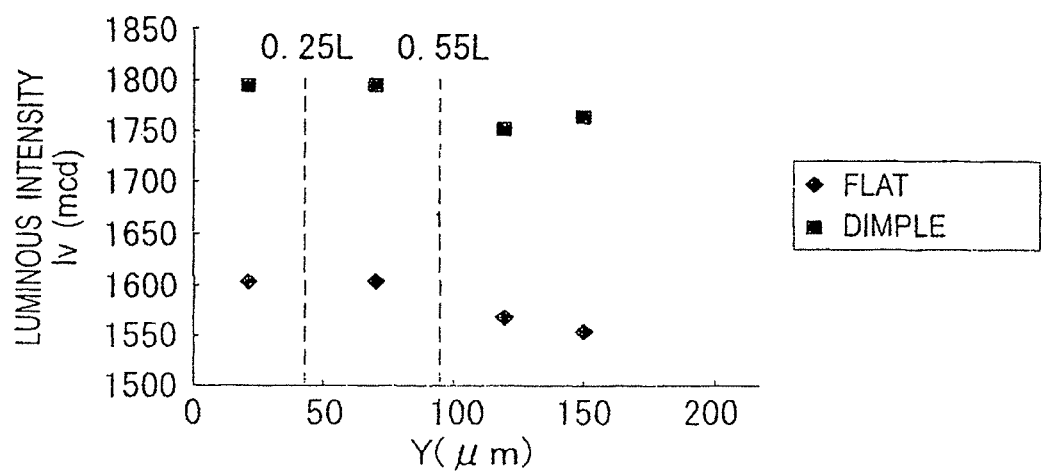
FIG. 6A is a graph showing the dependency of luminous intensity on the distance Y between the end of the p-side pad electrode and the periphery of the translucent electrode.
Figure 6B:
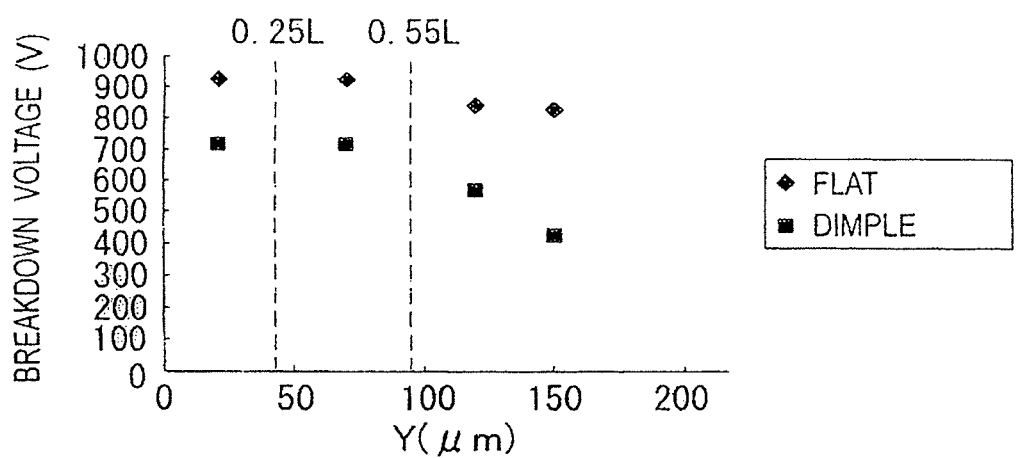
FIG. 6B is a graph showing the dependency of breakdown voltage on the distance Y between the end of the p-side pad electrode and the periphery of the translucent electrode.
Figure 6C:
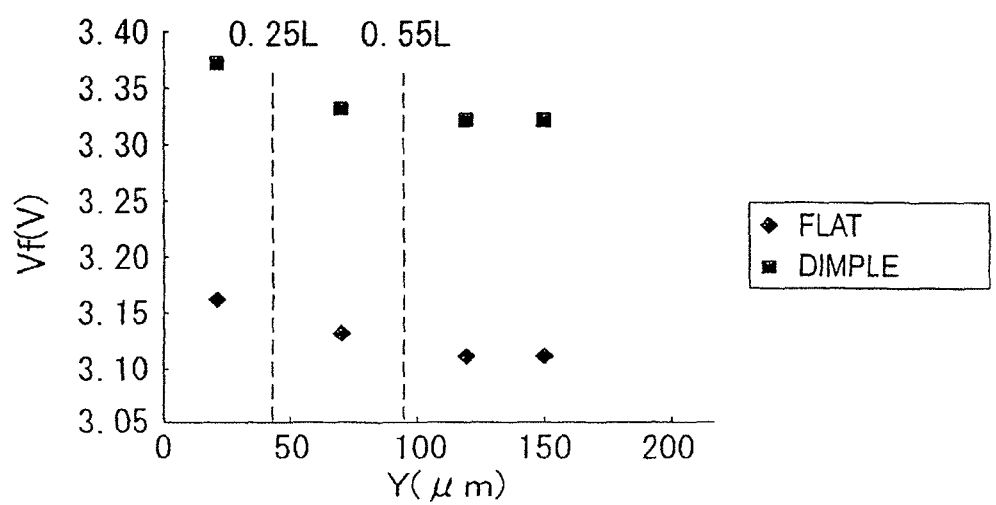
FIG. 6C is a graph showing the dependency of Vf on the distance Y between the end of the p-side pad electrode and the periphery of the translucent electrode.

The relationship between the position of the p-side pad electrode 16 and the characteristics of the device will now be described. FIG. 5A, FIG. 5B and FIG. 5C are graphs showing the dependency of luminous intensity Iv (mcd), breakdown voltage (V) and Vf (V) of the device, respectively, on the distance X between the pad electrodes. FIG. 6A through FIG. 6C show the dependency of these characteristics on the distance Y between the end of the p-side pad electrode 16 and the periphery of the translucent electrode 14. Breakdown voltage is given in terms of mean value of voltages at which 60 samples of the device were destroyed. FIG. 5A through FIG. 5C show that shorter distance X between the pad electrodes leads to lower luminous intensity and lower breakdown voltage but better Vf. FIG. 6A through FIG. 6C show that longer distance Y leads to lower luminous intensity and lower breakdown voltage but better Vf.

As can be seen from FIG. 4A to FIG. 4D, FIG. 5A to FIG. 5C and FIG. 6A to FIG. 6C, uniformity of light emission can be improved further and the value of Vf can be decreased while maintaining the luminous intensity of emission and breakdown voltage of the device at high levels, by disposing the p-side pad electrode 16 at a position that satisfies the following relationships: $0.4L \leq X \leq 0.7L$ and $0.25L \leq Y \leq 0.55L$. When X is larger than the range described above, intensity of light emitted in the area interposed between the n-side pad electrode 12 and the p-side pad electrode 16 decreases and the value of Vf becomes higher. When X is too small, on the other hand, current is concentrated in the area between the pad electrodes, resulting in low luminous intensity of emission and low breakdown voltage. When Y is larger than the range described above, intensity of light emitted in the area interposed between the p-side pad electrode 16 and the periphery of the translucent electrode 14 decreases, resulting low luminous intensity. When Y is smaller than the range described above, current path from the p-side pad electrode 16 to the opposite side of the n-side pad electrode 12 is interrupted to become shorter, thus making it impossible for the current injected from the p-side pad electrode 16 to spread in every direction. The p-side pad electrode 16 is preferably disposed so as to satisfy the following relationships: $0.5L \leq X \leq 0.6L$ and $0.3L \leq Y \leq 0.5L$, so that uniformity of light emission can be improved further and the value of Vf can be decreased.

Figure 5D:
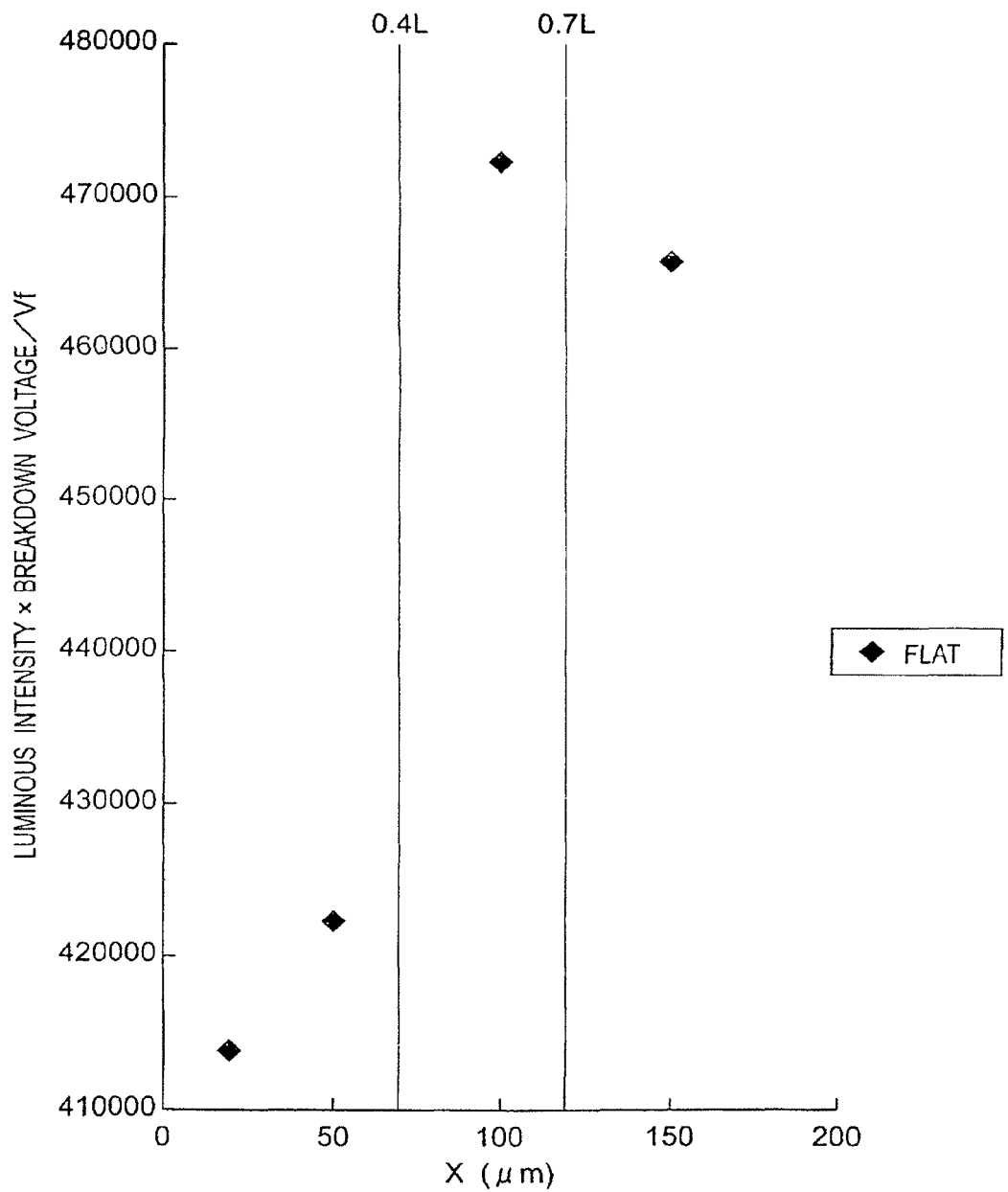
FIG. 5D is a graph showing the dependency of luminous intensity Iv×breakdown voltage/Vf on the end-to-end distance X between the p-side pad electrode and the n-side pad electrode.
Figure 5E:
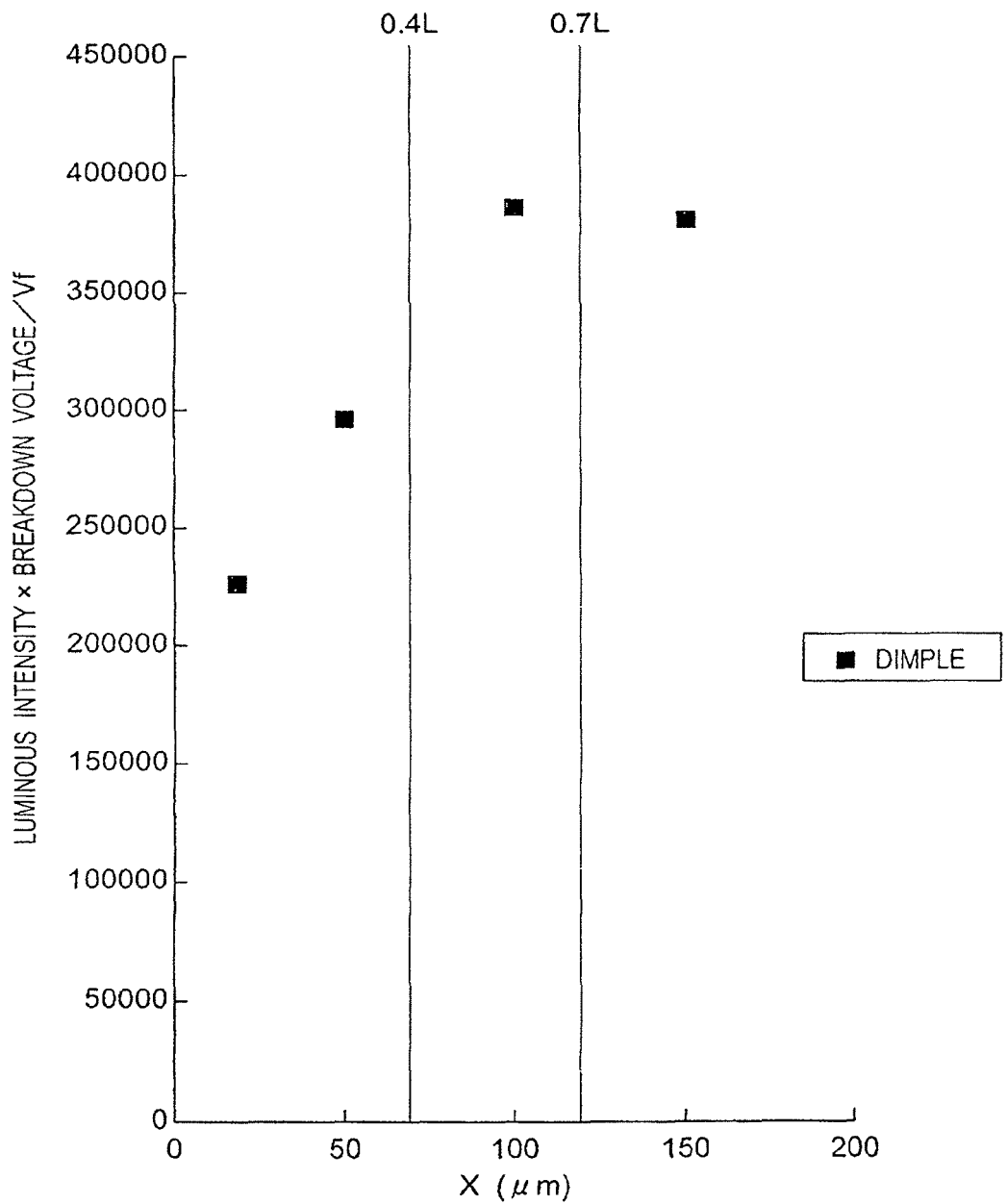
FIG. 5E is a graph showing the dependency of luminous intensity Iv×breakdown voltage/Vf on the end-to-end distance X between the p-side pad electrode and the n-side pad electrode.
Figure 6E:
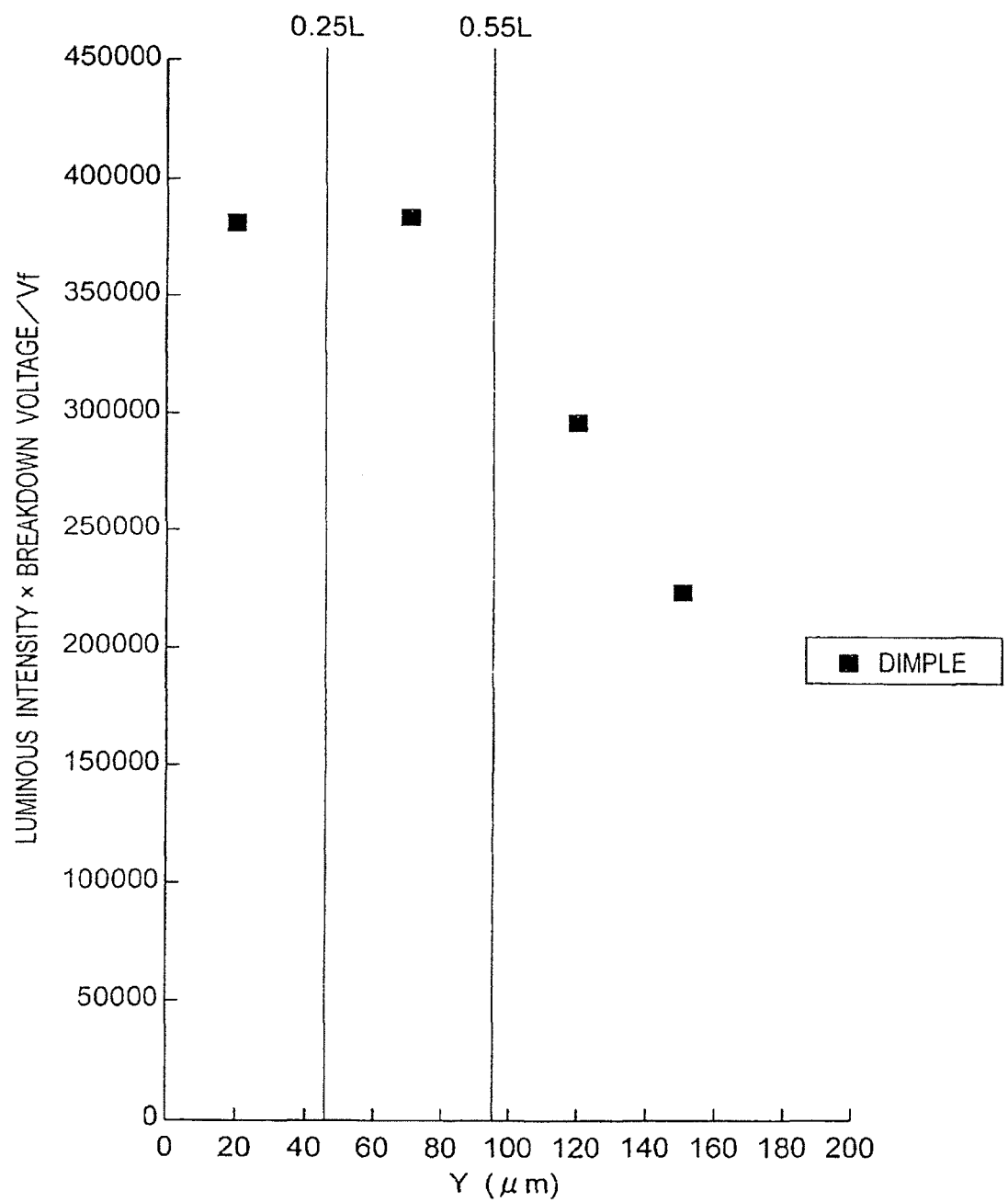
FIG. 6E is a graph showing the dependency of luminous intensity Iv×breakdown voltage/Vf on the distance Y between the end of the p-side pad electrode and the periphery of the translucent electrode.

The relationships described above become more apparent by making reference to FIGS. 5D and 5E and FIGS. 6D and 6E. FIGS. 5D and 5E are graphs showing the relationship between luminous intensity Iv (mcd)×breakdown voltage (V)/Vf (V) and the distance X between the pad electrodes. FIGS. 6D and 6E are graphs showing the relationship between luminous intensity Iv (mcd)×breakdown voltage (V)/Vf (V) and the distance Y. Plotting luminous intensity Iv (mcd)×breakdown voltage (V)/Vf (V) against X and Y enables it to more clearly understand the effect of the present invention that the value of Vf can be decreased while maintaining the luminous intensity of emission and breakdown voltage of the device at high levels. As can be seen from FIGS. 5D and 5E, value of luminous intensity Iv (mcd)×breakdown voltage (V)/Vf (V) becomes maximum when the distance X between the pad electrodes is 0.59L (100 μm). As can be seen from FIGS. 60 and 6E, value of luminous intensity Iv (mcd)× breakdown voltage (V)/Vf (V) becomes maximum when the distance Y is 0.41L (70 μm).

The present invention is characterized in the capability of not only improving the uniformity of light emission but also balancing three parameters of luminous intensity, breakdown voltage and Vf. In the nitride semiconductor light emitting device of the prior art, it has been common to dispose the p-side pad electrode and the n-side pad electrode at either end of the device, so as to ensure longer distance between the p-side pad electrode and the n-side pad electrode, since sole emphasis was placed on the improvement of the uniformity of light emission. It was found that, in case a translucent electrode made of electrically conductive oxide is used, however, a device having excellent characteristics can be obtained with the three parameters of luminous intensity, breakdown voltage and Vf well balanced, by disposing the p-side pad electrode at a mid position between the center and end of the device.

FIG. 5A to FIG. 5E and FIG. 6A to FIG. 6E show device characteristics in both cases where the substrate 2 has the irregular structure 18 (denoted as "dimpled" in the drawing) formed thereon and does not have the irregular structure (denoted as "flat" in the drawing). In case the substrate 2 has the irregular structure 18 formed thereon, breakdown voltage and Vf are inferior to those of flat substrate, although luminous intensity is improved by 10% or more. In both cases where the substrate 2 has the irregular structure 18 and does not, the device characteristics show similar changes with the position of the p-side pad electrode 16, and therefore it can be seen that uniformity of light emission can be improved further and the value of Vf can be decreased by disposing the p-side pad electrode 16 in such a manner that satisfies the relationship described above, regardless of whether the substrate 2 has the irregular structure 18 or not.

In this embodiment, a plurality of columnar protrusions 20 constituted from the p-type nitride semiconductor layer 8, the active layer 6 and the top portion 4' of the n-type nitride semiconductor layer 4 are formed on the bottom portion 4" of the n-type nitride semiconductor layer 4 (exposed surface). As described previously, the protrusions 20 reflect the light which propagates in the transverse direction within the device so as to propagate in the longitudinal direction (in the direction perpendicular to the principal surface of the device). Forming the protrusions 20 along the periphery of the device further enhances the effect of making the emission uniform by the arrangement of the p-side pad electrode 16. That is, when the p-side pad electrode 16 is disposed within a predetermined area as shown in FIG. 4A to FIG. 4D, the protrusions 20 disposed along the periphery of the device also emit light uniformly. The effect of the present invention in making the emission uniform becomes more remarkable by forming the protrusions 20 particularly in the area along the periphery of the device located opposite to the n-side pad electrode 12 via the n-side pad electrode 16. For example, in the area along the periphery of the device located opposite to the n-side pad electrode 12 via the n-side pad electrode 16, emission from the protrusions 20 is significantly lower with the arrangement shown in FIG. 4A than the other area along the periphery of the device, while the protrusions 20 emit intense light similarly to other area along the periphery of the device with the arrangements shown in FIG. 4B and FIG. 4C (especially FIG. 4B). Peripheral portion (area outside of the p-type nitride semiconductor layer 8) of the device does not emit light since current does not flow in this portion. When FIG. 4A is compared with FIG. 4B and FIG. 4C, however, it can be seen that the area along the periphery of the device located opposite to the n-side pad electrode 12 via the n-side pad electrode 16 does not make significant contribution to the emission of light with the arrangement shown in FIG. 4A, while the entire device contributes to the emission with the arrangement shown in FIG. 4B and FIG. 4C. The protrusions 20 formed along the periphery of the device are located outside of the active region of the device, and therefore do not have adverse effect on Vf and breakdown voltage. Therefore, forming the protrusions 20 on the exposed surface of the n-type nitride semiconductor layer 4 along the periphery of the device of the present invention makes it possible to have the entire device contribute to the emission thereby achieving high luminous intensity and low value of Vf simultaneously at a higher level.

The effect of the present invention is remarkable particularly when the device has a rectangular external shape of high aspect ratio. This is because a device having rectangular shape has longer path from the p-side pad electrode to the n-side pad electrode than a square device having the same surface area. In case the device has a rectangular shape, the aspect ratio is preferably from 1.5 to 5, more preferably from 2 to 4.

In the case of face-up mounting of the nitride semiconductor light emitting device, the p-side pad electrode 16 blocks the emitted light and therefore smaller size thereof leads to higher efficiency of light emission. However, in the case of a device having rectangular shape, smaller size along the shorter side of the p-side pad electrode 16 causes an increasing tendency of current concentrating in a band-shaped portion connecting the area of the p-side pad electrode 16 and the area of the n-side pad electrode 12. In such a rectangular device 1, it is preferable to make the dimension of the p-side pad electrode 16 in the direction parallel to the shorter side of the device not less than 20% of the dimension of the light emitting area measured along the same direction (substantially equal to the dimension of the translucent electrode 14), which mitigates the current concentration and makes the light emission uniform. It is also preferable that the n-side pad electrode 12 has similar dimensional relationship with respect to the light emitting area. Specifically, it is preferable in the rectangular device 1 to make the dimensions of the n-side pad electrode 12 and the p-side pad electrode 16 in the direction parallel to the shorter side of the device not less than 20% of the dimension of the translucent electrode 14, which improves the uniformity of light emission.

The nitride semiconductor light emitting device 1 of the present invention provides not only excellent device performance but also the effect of suppressing the ratio of defective products caused by wire bonding failure arising during assembly in the low-profile light emitting apparatus. The effect of suppressing the ratio of defective products, which will be described below, is particularly significant in case the device has rectangular shape.

Figure 7:
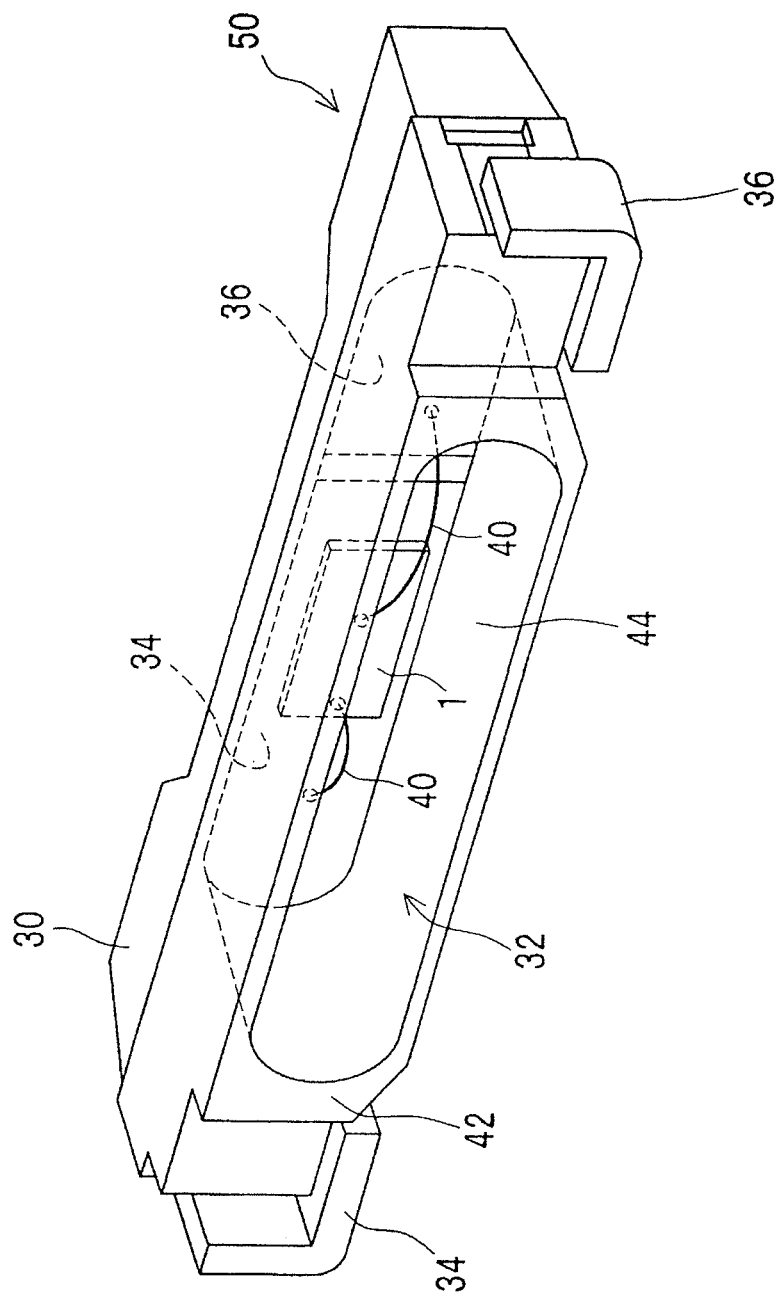
FIG. 7 is a perspective view schematically showing a light emitting apparatus according to one embodiment of the present invention.
Figure 8:
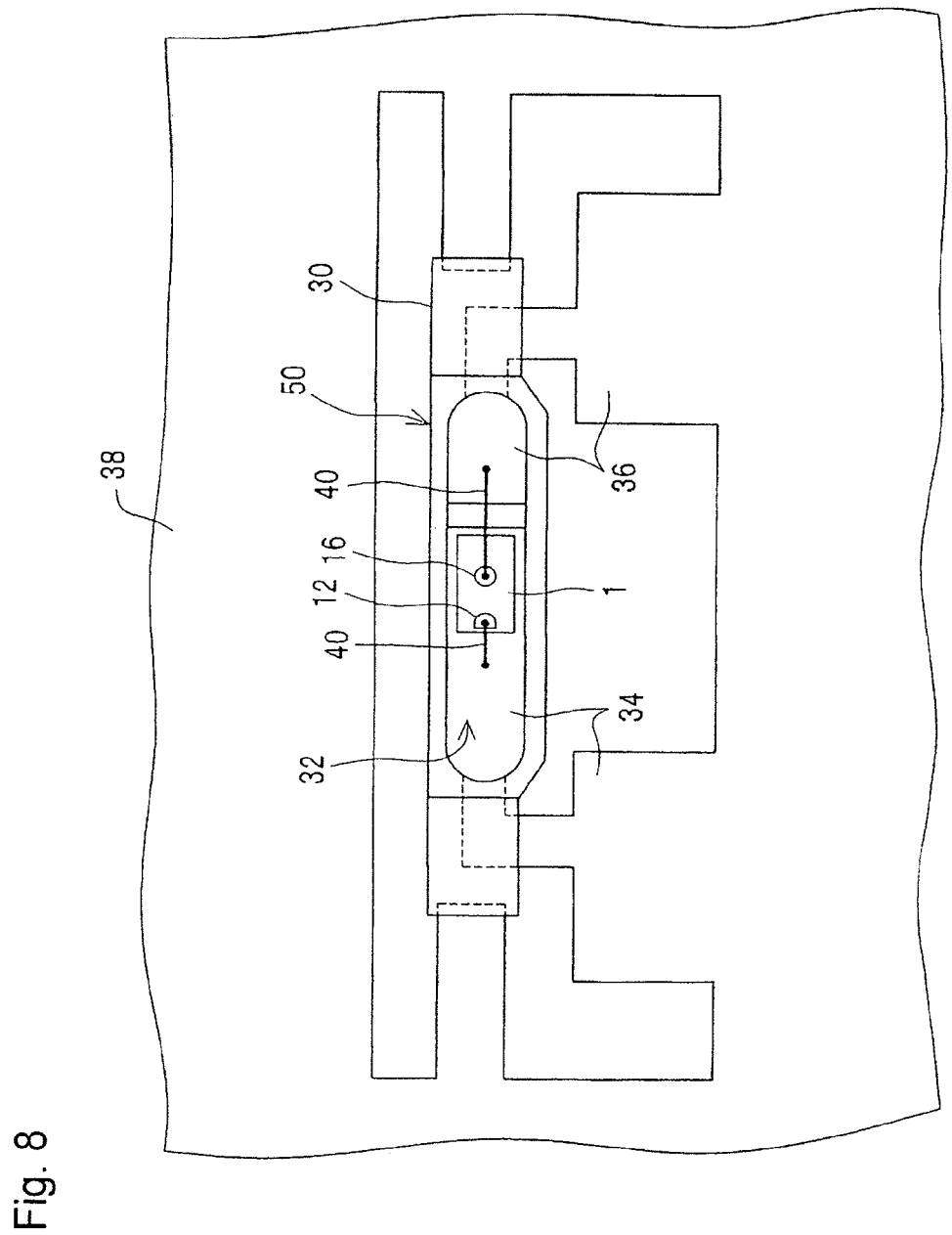
FIG. 8 is a front view schematically showing a light emitting apparatus according to one embodiment of the present invention.
Figure 9:
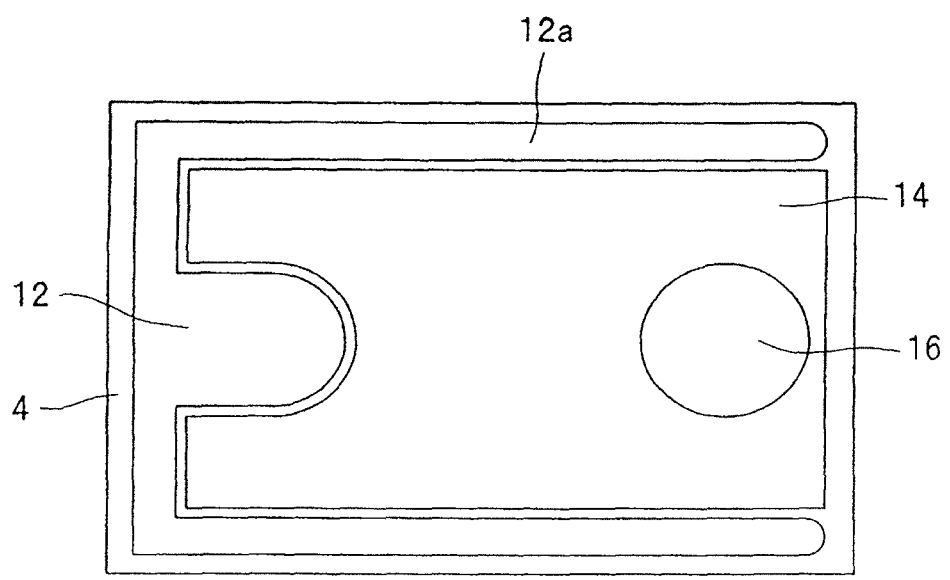
FIG. 9 is a plan view showing an example of nitride semiconductor light emitting device of the prior art.

FIG. 7 and FIG. 8 are a perspective view and front view, respectively, showing an example of the low-profile light emitting apparatus 50 according to the present invention. As shown in FIG. 7 and FIG. 8, the low-profile light emitting apparatus 50 of this embodiment comprises the nitride semiconductor light emitting device 1 of rectangular shape and a package 30 having a recess 32 formed on the side of the light emitting surface 42. The light emitting device 1 is mounted so as to be contained within the recess 32 of the package 30. Specifically, a p-side lead electrode 36 and an n-side lead electrode 34 are exposed on the inner surface of the recess 32 of the package 30, and the device 1 is bonded onto the surface of the n-side lead electrode 34. The pad electrodes 12, 16 and the lead electrodes 34, 36 of the device 1 are electrically connected with each other by means of electrically conductive wires 40. The package 30 has flat shape with dimension in one direction made smaller than the dimension in the other direction when viewed from the side of light emitting surface 42. Accordingly, the recess 32 also becomes flat-shaped. In a preferable form of the package 30, the recess 32 has an elongated rectangular or oval shape with an aspect ratio of 2 or larger, when viewed from the side of light emitting surface 42.

To manufacture the light emitting apparatus 50, first the nitride semiconductor light emitting device 1 is secured onto the surface of the n-side lead electrode 34 which is exposed in the recess 32 of the package 30. Then the p-side pad electrode 16 is connected to the p-side lead electrode 36 and the n-side pad electrode 12 is connected to the n-side lead electrode 34 by wire bonding with the electrically conductive wires 40.

The nitride semiconductor light emitting device 1 is secured in the recess 32 of the package 30 in such a manner as the direction of the longer side of the device 1 (namely the direction parallel to the longer side) substantially agrees with the direction of the major axis of the recess 32. The major axis of the recess 32 refers to the direction parallel to the major axis of the shape (substantially rectangular or oval shape) of the recess 32 viewed from the side of light emitting surface 42. As can be seen from the drawing, dimension of the recess 32 is very small in the direction of the minor axis thereof (direction perpendicular to the major axis), slightly larger than the shorter side of the light emitting device 1 (namely the direction parallel to the shorter side). This is for the purpose of making the light emitting apparatus 50 with low profile. In this light emitting apparatus 50, the electrically conductive wires 40 are disposed to run in a direction of the major axis of the recess 32. A capillary of a wire bonder used in this operation is slightly narrower than the dimension of the recess 32 of the package 30 along the minor axis thereof, and has very low degree of freedom in the minor axis direction of the recess 32.

When the device is bonded onto the lead electrode, there may be a case in which the device is displaced from the predetermined position. One example of displacement, θ displacement, is an angular displacement caused by turning from a predetermined position. The θ displacement causes the pad electrodes 12, 16 to be displaced in the direction of shorter side and in the direction of longer side. Especially in case the pad electrodes 12, 16 undergo significant displacement in the direction of the shorter side, since the capillary of the wire bonder has low degree of freedom in the direction of the minor axis of the recess 32, it may become impossible to wire-bond the electrically conductive wires 40 at the positions of the pad electrodes 12, 16, thus making the light emitting apparatus 50 defective. The displacement in the direction of the shorter side due to the θ displacement becomes conspicuous as the major axis of the device 1 becomes longer.

The nitride semiconductor light emitting device 1 of the present invention has the p-side pad electrode 16 located at a position nearer to the center than the end of the device 1, in order to improve the device characteristics. As a result, the p-side pad electrode 16 undergoes less displacement in the direction of the shorter side even when θ displacement occurs, and the problem of inability of wire-bonding the electrically conductive wires 40 does not occur so that the ratio of defective products can be decreased.

Constitution of the nitride semiconductor light emitting device 1 of this embodiment will now be described in detail.
(Translucent Electrode 14)

The translucent electrode 14 is formed from electrically conductive oxide. The electrically conductive oxide preferably includes at least one element selected from the group consisting of zinc, indium, tin and magnesium. Specifically, ITO (indium oxide doped with tin), ZnO, $In_2O_3$, $SnO_2$ or the like is preferably used. These materials have high translucency and are therefore particularly preferable. The translucent electrode 14 is preferably formed over substantially the entire surface of the p-type nitride semiconductor layer 8, so as to allow current flow uniformly through the p-type nitride semiconductor layer 8. Sheet resistance of the translucent electrode 14 is preferably from 10 to 30 Ωcm, more preferably from 15 to 25 Ωcm. Thickness of the translucent electrode 14 is determined depending on the relationship between the sheet resistance and transmittance to light, and is normally set in a range from 50 Å to 10 μm. In case the translucent electrode 14 is formed from ITO, in particular, it is preferable to set the thickness to 0.5 μm or less which enables it to form the translucent electrode 14 which has high translucency and sheet resistance in a range from 10 to 30 Ωcm.
(N-Side Pad Electrode 12, P-Side Pad Electrode 16)

The n-side pad electrode 12 and the p-side pad electrode 16 may be formed from metal or alloy including at least one kind selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag) and yttrium (Y), or an oxide or a nitride of such a metal. A transparent electrically conductive oxide such as ITO, ZnO, $In_2O_3$ or the like may also be preferably used. The electrodes may also be formed in either a single layer or multiple layers, with no restrictions on the thickness which can be determined in accordance to the desired characteristics. The pad electrode and the linear extension thereof may not necessarily be formed integrally from the same material and, instead, may be formed from different materials and/or have different thicknesses. The portion which provides the base for the pad electrode preferably has a thickness and surface area that are sufficient to provide for satisfactory connection with external electrodes. It is preferable that the portion which provides the base for the pad electrode has circular shape measuring 100 μm or less in diameter. In the case of a rectangular device, diameter of the portion which provides the base for the pad electrode is preferably not smaller than 20% of the width of the translucent electrode 14 (namely the dimension along the shorter side of the device). For example, the pad electrode 70 μm in diameter may be formed on a device having the translucent electrode 14 measuring 290 μm in width.

The n-side pad electrode 12, in particular, may be formed in various constitutions which may be determined in accordance to such requirements as ohmic contact property, bonding property, preventing diffusion of impurity and bonding with wire. For example, such a constitution may be employed as a first layer is formed on the n-type semiconductor layer from W, Mo, Ti or the like which has favorable ohmic contact property and bonding property with the n-type semiconductor layer, and a second layer for the pad is formed thereon from gold, aluminium or a platinum group metal which has favorable bonding property with wire, such as Ti/Au or Ti/Al. The electrode may also be formed in 3-layer structure having a layer formed from a metal of high melting point (W, Mo, platinum group metal) as a barrier layer between the first layer intended for ohmic contact and the second layer for pad, such as W/Pt/Au, Ti/Rh (second layer a)/Pt (second layer b)/Au. Particularly it is preferable to use Rh which has high reflectivity and high barrier property as the barrier layer, since it improves the efficiency of extracting light.

According the present invention, uniformity of light emission is improved by selecting the position of the p-side pad electrode 16, and therefore it is not necessary to provide the pad electrode with a long extension for diffusing current. Accordingly, while the n-side pad electrode 12 may be provided with an electrically conductive extension which extends linearly, it is preferable that length of the n-side pad electrode 12 including the extension is not larger than one side of the translucent electrode 14. In other words, it is preferable that the n-side pad electrode 12 is formed so as to adjoin only one side of the perimeter of the translucent electrode 14, with no extension adjacent to the other sides. In this case, the sides of the perimeter of the translucent electrode 14 adjoin the periphery of the device, except for the side which adjoins the n-side pad electrode 12. This configuration enables it to maintain a large area from which light is emitted and improve the efficiency of light emission from the device.
(P-Side Pad Electrode 16)

The p-side pad electrode 16 is preferably formed in such a constitution as Ni/Au or Co/Au, stacked in this order from the semiconductor layer side, or electrically conductive oxide such as ITO, a metal of platinum group, Rh/Ir or Pt/Pd. The n-side pad electrode 12 and/or the p-side pad electrode 16 may be provided with an electrically conductive extension which extends linearly therefrom with such a length that does not significantly decrease the emission efficiency. This makes it possible to have the entire active layer emit light efficiently and is effective in mounting the device face-up. The p-side pad electrode 16 may be formed either on the translucent electrode 14 or through the opening in the translucent electrode 14 so as to make contact with the p-type nitride semiconductor layer. In the latter case, the p-side pad electrode 16 is connected to the translucent electrode 14 through the inner surface of the through hole.
(Substrate 2)

The substrate whereon the semiconductor layers are to be formed may be made of an insulating material such as sapphire or spinel (MgAl$_2$O$_4$) having principal surface in C plane, R plane or A plane. The substrate may also be made of SiC (including 6H, 4H, 3C), ZnS, ZnO, GaAs, Si or the like. The substrate may also be made of an oxide which has crystal lattice matching the nitride semiconductor, of which sapphire is preferable. The insulating substrate may or may not be removed in the end. The substrate may, in addition to the n-type nitride semiconductor layer 4, the active layer 6 and the p-type nitride semiconductor layer 8, have a crystal nucleus forming layer, a low-temperature growth buffer layer, a high-temperature growth layer, a mask layer, an intermediate layer or the like formed thereon as base layer.
(N-Type Nitride Semiconductor Layer 4, Active Layer 6, P-Type Nitride Semiconductor Layer 8)

As the nitride semiconductor, GaN, AlN, InN or nitride of III-V group element (In$_x$Al$_y$Ga$_{1-x-y}$N (0≤X, 0≤Y, X+Y≤1)) which is a mixture of the former may be used. A part or all of the group III element may be replaced by B, and a part of N, the group V element, may be replaced by P, As or Sb. The nitride semiconductor layer is typically doped with an impurity of either n type or p type. While the semiconductor layer may be formed in single-layer structure, it may also have multi-layer structure such as homojunction structure, heterojunction structure, double-heterojunction structure or the like having MIS junction, PIN junction or PN junction. The semiconductor layer can be formed by, for example, employing a known technology such as metalorganic chemical vapor phase deposition (MOCVD), hydride vapor phase epitaxy (HVPE) or molecular beam epitaxy method. There is no limitation on the thickness of the semiconductor layer, and semiconductor layers of various thicknesses can be used.

The n-type nitride semiconductor layer 4 preferably has such a structure that includes impurity and achieves supply and diffusion of carrier within the electrode forming surface and to the light emitting layer. In order to supply the carrier from the electrode into the active layer 6 and diffuse the carrier within the plane, in particular, it is preferable to provide a contact layer which is doped with a relatively high concentration. It is also preferable to provide an intervening layer for moving and supplying the charge to the active layer 6 in the direction of stacking, a cladding layer which confines the p-type carrier within the light emitting layer or the like. The layer provided between the active layer 6 and the contact layer is preferably a nitride semiconductor layer which is doped with a relatively low concentration or not doped at all, and/or a multi-layer film. This enables it to improve the crystallinity of the cladding layer and/or the active layer 6 formed thereon, accelerate the diffusion of current within the plane during operation and improve the withstanding voltage. The multi-layer film is preferably formed in periodical structure consisting of at least two kinds of layer stacked alternately, or super lattice structure.

For the active layer 6, it is preferable to use nitride semiconductor including In which enables it to emit light with satisfactory efficiency over a region ranging from ultraviolet to visible light (red). It is also preferably formed in quantum well structure such as single quantum well structure or multiple quantum well structure.

It is preferable that the p-type nitride semiconductor layer 8 has a cladding layer which confines the n-type carrier within the active layer 6, a contact layer whereon the electrode is formed, or the like. In the nitride semiconductor, it is preferable to use a nitride semiconductor which includes Al as the cladding layer. There may also be provided, between the contact layer and the cladding layer, a layer including impurity of lower concentration than in these layers. This enables it to make the device having high electrostatic voltage resistance and improve the crystallinity even when the contact layer is doped with a high concentration.

Specifically, for example, a GaN buffer layer and an undoped GaN layer are formed as base layers on the sapphire substrate 2, an Si-doped GaN layer which becomes the n-type contact layer and an Si-doped GaN layer which becomes the n-type cladding layer are formed as the n-type nitride semiconductor layer 4, an InGaN layer is formed as the active layer 6, and an Mg-doped AlGaN layer which becomes the p-type cladding layer and an Mg-doped GaN layer which becomes the p-type contact layer are formed as the p-type nitride semiconductor layer 8.
(Translucent Resin 44)

In a light emitting apparatus 50, the recess 32 of the package 30 may be sealed off with a translucent resin 44, in order to protect the nitride semiconductor light emitting device 1 from the environment. The recess 32 of the package 30 is filled with the translucent resin 44 of a quantity larger than that required to cover the nitride semiconductor light emitting device 1 and electrically conductive wires 40, and is then hardened to complete the sealing.

As the translucent resin 44, materials having high weatherability such as silicone resin, epoxy resin, urea resin, fluorocarbon resin and a hybrid resin which includes at least one of these resins may be used. Instead of the translucent resin, an inorganic material having high weatherability such as glass or silica gel may also be used.

(Option of LED, White)

The nitride semiconductor light emitting device 1 of the present invention may have a light transforming member which transforms part of light emitted by the light emitting element to light of different wavelength. This provides a light emitting apparatus which transforms light emitted by the light emitting element, a light emitting apparatus 50 which emits white light or color of incandescent light by mixing light emitted by the light emitting element and transformed light. The light emitting apparatus 50 which emits white light may be made by combining a blue-light emitting diode 1 and a light transforming member. The actual light emitting apparatus 50 preferably has such a constitution as a light transforming member in the form of pellets is dispersed in a translucent resin 44.

The light transforming member may be aluminum garnet-based fluorescent material including Al, at least one element selected from among Y, Lu, Sc, La, Gd, Tb, Eu and Sm and at least one element selected from among Ga and In, or aluminum garnet-based fluorescent material including at least one element selected from among rare earth elements. This constitution enables it to provide a light emitting apparatus having high temperature characteristic and high durability even when the light emitting element is operated with such a high output power that generates a large amount of heat.

The light transforming member may also be a fluorescent material represented by $(Re_{1-x}R_x)_3(Al_{1-y}Ga_y)_5O_{12}$ ($0<x<1$, $0\leq y\leq 1$, Re represents at least one kind of element selected from among Y, Gd, La, Lu, Tb and Sm, and R represents Ce or Ce and Pr). This constitution, similarly to that described above, makes a high-output light emitting device that shows good temperature characteristic and high durability, and has temperature characteristic resembling the black body radiation which is advantageous in emitting white light when the active layer is formed from InGaN.

Furthermore, the light transforming member may also be a nitride-based fluorescent material which includes N, at least one element selected from among Be, Mg, Ca, Sr, Ba and Zn and at least one element selected from among C, Si, Ge, Sn, Ti, Zr and Hf, and is activated with at least one element selected from among rare earth elements. Specifically, a fluorescent material represented by general formula $L_XSi_YN_{(2/3X+4/3Y)}$:Eu or $L_XSi_YO_ZN_{(2/3X+4/3Y-2/3Z)}$:Eu (L represents Sr or Ca, or Sr and Ca). This constitution, similarly to that of the fluorescent material described above, makes a high-output light emitting device that shows good temperature characteristic and high durability. Among these materials, silicon oxide nitride compound is the most preferable. When a nitride fluorescent material and aluminum garnet-based fluorescent material described above are used in combination, a light emitting device that has less temperature dependency of the blended light color can be made due to the synergy effect of the temperature characteristics of both materials.

What is claimed is:

1. A nitride semiconductor light emitting device comprising:
    a substrate,
    an n-type nitride semiconductor layer formed on the substrate;
    a p-type nitride semiconductor layer formed on the n-type nitride semiconductor layer,
    an n-side pad electrode formed on a surface of the n-type nitride semiconductor layer which is exposed by removing
      the p-type nitride semiconductor layer and
      a part of the n-type nitride semiconductor layer,
    a translucent electrode formed on the p-type nitride semiconductor layer, and
    a p-side pad electrode formed within a surface of the translucent electrode,
    wherein the translucent electrode is formed from an electrically conductive oxide, the n-side pad electrode adjoins a periphery of the translucent electrode and the p-side pad electrode is disposed so as to satisfy the following relationships:

$$0.4<X/Y<2.8$$

where
      X is a distance between ends of the p-side pad electrode and the n-side pad electrode, and
      Y is a distance between an end of the p-side pad electrode on a side opposite to the n-side pad electrode, and a periphery of the translucent electrode on a line connecting centroids of the n-side pad electrode and the p-side pad electrode.

2. The nitride semiconductor light emitting device according to claim 1, wherein
    X is a distance between said ends of the p-side pad electrode and the n-side pad electrode, wherein
      one of said ends is an end of the p-side pad electrode nearer to the n-side pad electrode, and
      another of said ends is an end of the n-side pad electrode nearer to the p-side pad electrode, and
    Y is a distance between the end of the p-side pad electrode on a side opposite to the n-side pad electrode, and said periphery of the translucent electrode on the line connecting the centroids of the n-side pad electrode and the p-side pad electrode,
      wherein said periphery of the translucent electrode is a periphery of the translucent electrode located on a side opposite to the n-side pad electrode on the line connecting the centroids of the n-side pad electrode and the p-side pad electrode.

3. The nitride semiconductor light emitting device according to claim 1, wherein an end of the n-side pad electrode adjoins a periphery of the translucent electrode.

4. The nitride semiconductor light emitting device according to claim 1, wherein the n-side pad electrode and the p-side pad electrode are dimensioned such that:
    in a direction parallel to a shorter one of X or Y, dimensions of the n-side pad electrode and the p-side pad electrode are not less than 20% of a dimension of the translucent electrode.

5. The nitride semiconductor light emitting device according to claim 1, wherein the n-side pad electrode and the p-side pad electrode have circular shapes measuring 100 μm or less in diameter.

6. The nitride semiconductor light emitting device according to claim 1, wherein the n-side pad electrode and the p-side pad electrode each comprise at least one material selected from the group consisting of chromium and titanium.

7. The nitride semiconductor light emitting device according to claim 1, wherein the n-side pad electrode comprises a material selected from the group consisting of: chromium, titanium, chromium and titanium, gold, titanium and gold.

8. The nitride semiconductor light emitting device according to claim 1, further comprising a nitride semiconductor light emitting device package having a rectangular shape.

9. The nitride semiconductor light emitting device according to claim 1, wherein an irregular structure comprising at least one dimple is formed on a surface of the substrate.

10. The nitride semiconductor light emitting device according to claim 1, wherein the substrate is made of sapphire.

11. The nitride semiconductor light emitting device according to claim 1, wherein the n-type nitride semiconductor layer, an active layer and the p-type nitride semiconductor layer, one on another on the substrate form a double-heterojunction structure.

12. The nitride semiconductor light emitting device according to claim 1, wherein
the active layer has a multiple quantum well structure.

13. The nitride semiconductor light emitting device according to claim 1, wherein an exposed surface of the n-type nitride semiconductor layer on which the n-side pad electrode is formed is a substantially semi-circular exposed region.

14. The nitride semiconductor light emitting device according to claim 1, wherein the n-type nitride semiconductor layer and the p-type nitride semiconductor layer are made of a nitride semiconductor including one of GaN, AlN, InN or a nitride of III-V group element.

15. The nitride semiconductor light emitting device according to claim 1, wherein the n-type nitride semiconductor layer comprises a contact layer which is doped with a relatively high concentration.

16. The nitride semiconductor light emitting device according to claim 15, further comprising:
an active layer and another layer provided between the active layer and the contact layer, wherein said another layer is a nitride semiconductor layer which is doped with a relatively low concentration or is not doped.

17. The nitride semiconductor light emitting device according to claim 15, further comprising:
an active layer and another layer provided between the active layer and the contact layer, wherein said another layer is a multi-layer film which includes a super lattice structure.

18. The nitride semiconductor light emitting device according to claim 1, wherein a base layer is directly formed on the substrate, said base layer being a base layer for said n-type nitride semiconductor layer, and
said base layer comprises a low-temperature growth buffer layer.

19. The nitride semiconductor light emitting device according to claim 1, wherein
the substrate is a sapphire substrate, and
a base layer is directly formed on the sapphire substrate, said base layer being a base layer for said n-type nitride semiconductor layer, and said base layer comprises an undoped GaN layer, and
a Si-doped GaN layer is formed as an n-type contact layer on said undoped GaN layer.

20. The nitride semiconductor light emitting device according to claim 1, wherein the translucent electrode is formed from an electrically conductive oxide with a higher sheet resistance than that of the n-type nitride semiconductor layer, wherein the electrically conductive oxide comprises zinc.

21. The nitride semiconductor light emitting device according to claim 1, wherein the translucent electrode is formed from an electrically conductive oxide with a higher sheet resistance than that of the n-type nitride semiconductor layer, wherein the electrically conductive oxide comprises at least one element selected from the group consisting of zinc, indium, tin and magnesium.

22. The nitride semiconductor light emitting device according to claim 20, wherein a sheet resistance of the translucent electrode is from 10 to 30 Ωcm.

23. The nitride semiconductor light emitting device according to claim 1, wherein the translucent electrode is formed from an electrically conductive oxide and a thickness of the translucent electrode is set in a range from 50 Å to 10 µm.

24. The nitride semiconductor light emitting device according to claim 1, wherein
the p-side pad electrode is formed through an opening in the translucent electrode, said opening being an opening of a through hole in the translucent electrode, and
the p-side pad electrode is connected to the translucent electrode through an inner surface of the through hole.

25. The nitride semiconductor light emitting device according to claim 1, wherein
said n-type nitride semiconductor layer is located directly on the substrate, at least one layer is interposed between said n-type nitride semiconductor layer and the substrate.

* * * * *